United States Patent [19]

Wahl et al.

[11] Patent Number: 4,847,519
[45] Date of Patent: Jul. 11, 1989

[54] INTEGRATED, HIGH SPEED, ZERO HOLD CURRENT AND DELAY COMPENSATED CHARGE PUMP

[75] Inventors: Jerry R. Wahl, Lakeville; Richard E. Hester, Eden Prairie, both of Minn.

[73] Assignee: VTC Incorporated, Bloomington, Minn.

[21] Appl. No.: 108,543

[22] Filed: Oct. 14, 1987

[51] Int. Cl.$^4$ .................. H03K 3/01; H03K 17/60; H03K 5/22; H03F 3/45

[52] U.S. Cl. .................. 307/296.2; 307/296.4; 307/296.6; 307/255; 307/355; 307/270; 330/257

[58] Field of Search .............. 307/296.2, 296.4, 296.6, 307/270, 317 A, 255, 355, 356, 254; 330/257

[56] References Cited

U.S. PATENT DOCUMENTS

| 4,074,205 | 2/1978 | Robe | 330/257 |
|---|---|---|---|
| 4,259,599 | 3/1981 | Takada | 307/270 |
| 4,331,887 | 5/1982 | Jadus et al. | 307/270 |
| 4,363,978 | 11/1982 | Heimbigner | 307/473 |
| 4,403,158 | 9/1983 | Slemmer | 307/296.2 |
| 4,409,496 | 10/1983 | Baba | 307/296.2 |
| 4,410,858 | 10/1983 | Kusakabe | 307/355 |
| 4,464,632 | 8/1984 | Yoshihisa et al. | 330/257 X |
| 4,570,244 | 2/1986 | Sud et al. | 365/230 |
| 4,577,121 | 3/1986 | Sano et al. | 307/355 |
| 4,633,106 | 12/1986 | Backes et al. | 307/578 |
| 4,668,918 | 5/1987 | Adams | 307/511 |
| 4,748,346 | 5/1988 | Emori | 307/270 |
| 4,760,286 | 7/1988 | Pigott | 307/355 X |

Primary Examiner—Stanley D. Miller
Assistant Examiner—Huy Kim Mai
Attorney, Agent, or Firm—Kinney & Lange

[57] ABSTRACT

An integrated, high speed, zero hold current and delay compensated charge pump operable at one of two different selectable pumping currents. The charge pump includes first and second supply terminals, a first input terminal for receiving digital charge-up control signals, a second input terminal for receiving digital charge-down control signals, and an output terminal. A first transistorized differential amplifier controls a first current flow of a first polarity between the first supply terminal and the output terminal as a function of the charge-up control signals. A second differential amplifier controls a second current flow between the first and second supply terminals as a function of the charge-down control signals. A pump current mirror produces a mirrored second current flow of a second polarity between the output terminal and the second supply terminal as a function of the second current flow.

15 Claims, 3 Drawing Sheets

INTEGRATED, HIGH SPEED, ZERO HOLD CURRENT AND DELAY COMPENSATED CHARGE PUMP

BACKGROUND OF THE INVENTION

1. Field of the Invention

The present invention relates to charge pump circuits. In particular, the present invention is an integrated, zero hold current and delay compensated charge pump.

2. Description of the Prior Art

Charge pumps are commonly used circuits for controlling current flow. Digitally controlled charge pumps are often found in phase locked loops where they are used to control the sourcing of current into and sinking current from a filter coupled to the control input terminal of the voltage controlled oscillator. When operated in its charge-up mode, the charge pump will provide current to the filter thereby increasing the voltage on the filter and the frequency of the voltage controlled oscillator. When operated in its charge-down mode, the charge pump will draw current from the filter, thereby decreasing its voltage and the frequency of the voltage controlled oscillator. In its hold mode, the charge pump is essentially isolated from the filter. With current being neither drawn from nor supplied to the filter, its voltage and therefore the frequency of the voltage controlled oscillator are maintained at a steady state.

FIG. 1 is a schematic illustration of a known charge pump. The charge pump shown in FIG. 1 includes current sources 1, 2, and 3, and two emitter coupled pairs of transistors 4 and 5, and 6 and 7. Currents I1–I3 of the same magnitude are provided by current sources 1–3. This prior art charge pump is operated in a charge-up mode when logic HIGH, LOW charge-up signals are applied to the UP and UPN terminals and logic LOW, HIGH charge-down signals are applied the DN and DNN terminals, respectively. Transistor 4 will be turned ON and conduct current I2, while transistor 6 will be turned ON and conduct current I3. Since transistors 5 and 7 are turned OFF, current I1 is supplied or sourced to output terminal $I_0$. When the logic states of the signals are reversed (i.e. logic LOW, HIGH charge-up signals are applied to terminals UP and UPN, and logic HIGH, LOW charge-down signals are applied to terminals DN and DNN, respectively), transistors 4 and 6 are turned OFF while transistors 5 and 7 are turned ON. Both currents I2 and I3 will thereby be drawn from the node joining current source 1 to the collectors of transistors 5 and 7, while only current I1 is supplied to this node. Since the magnitude of currents I1, I2, and I3 are equal, an additional current will be sinked or drawn from output terminal $I_0$.

The charge pump shown in FIG. 1 is operated in its hold mode when the UP and UPN terminals receive charge-up signals having logic LOW and HIGH states, while the charge-down signals have logic LOW and HIGH states applied to the DN and DNN terminals, respectively. Transistors 5 and 6 are turned OFF, while transistors 4 and 7 are switched ON by these signals. Current I1 is thereby conducted through transistor 7, while current I2 is conducted through transistor 4. In theory current will be neither sourced to nor sinked from output terminal $I_0$ since currents I1 and I2 are of equal magnitude. When the charge-up and charge-down control signals are synchronized in time, no current will be output from the charge pump since the switching is very symmetrical, being performed differentially using NPN transistors 4–7.

In practice, however, the hold current is not zero when the charge pump is operated in its hold mode. A small amount of current will either flow to or be drawn from the output terminal of the charge pump. This can be a problem when the charge pump is used to control a phase lock loop, since it will lead to large amounts of steady-state error. Typically, the values of currents I1 and I2 are laser trimmed so that when the pump is in a hold state, very little current comes from the output terminal. The accuracy of this trimming operation can be to within plus or minus 0.1 percent. However, in many applications this will not result in a low enough hold current. Additionally, as supply voltages VCC and VEE vary, the hold current will get larger due to the mismatch of currents caused by the Early effect of the transistors. This effect is unavoidable with this type of pump.

Other current switching circuits are also known. The Jadus et al. U.S. Pat. No. 4,331,887 discloses current switch driving circuitry for supplying current to an output terminal. The output terminal is connected between a driving transistor and a sinking transistor. The driving and sinking transistors are coupled by logic signals applied to an ON control terminal, and an OFF control terminal. When both the ON and OFF control terminals are switched to a HIGH logic state, both driving and sinking transistors are switched OFF, preventing the output terminal from either sourcing or sinking current. The current will be sourced out of the output terminal when the ON control terminal is switched to a LOW logic state, and the OFF control terminal is switched to a HIGH logic state. When the OFF terminal is switched to a LOW logic state and the ON terminal is switched to a HIGH logic state, the sinking transistor is turned ON, and will draw current through the output terminal.

The Heimbigner U.S. Pat. No. 4,363,978 discloses a tristate driver circuit. The driver includes an output driver formed by two FETs having their source and drain terminals connected in series between a relatively positive potential $V_{DD}$ and a relatively negative potential $V_{SS}$. An output terminal is connected between the two transistors. The output driver is controlled by two NOR gates formed by several FETs, as well as by other FETs. A buffer is driven to its float mode, or tristated, when the F terminal and F(bar) terminal receive logic 1 and logic 0 signals, respectively. The transistors of the output driver are then turned OFF.

The Takada U.S. Pat. No. 4,259,599 discloses a complementary transistor switching circuit. Either one or the other of two complementary transistors is turned OFF regardless of the state of the drive transistor. The other transistor will be turned ON.

The Backes et al. U.S. Pat. No. 4,633,106 discloses an MOS bootstrap push-pull stage which uses a diode capacitor charge pump.

The Sud et al. U.S. Pat. No. 4,570,244 discloses a transistor capacitor charge pump which is turned ON and OFF with clock pulses.

It is evident that there is a continuing need for improved charge pumps. A charge pump having a zero hold current as well as symmetrical switching characteristics is desired. A charge pump having these characteristics which can operate at several different pumping currents would also be useful. The circuit must of course be relatively simple if it is to be commercially viable.

SUMMARY OF THE INVENTION

A digitally controlled charge pump in accordance with the present invention includes first and second supply terminals, first input terminal means for receiving first digital charge control signals, second input terminal means for receiving second digital charge control signals, and an output terminal. First differential means coupled to the first input terminal means control a first current flow of a first polarity between the first supply terminal and the output terminal as a function of the first input signal. Second differential means coupled to the second input terminal means control a second current flow between the first and second supply terminals as a function of the second input signal. Pump current mirror means coupled to the second differential means and between the output terminal and the second supply terminal control a mirrored second current flow of a second polarity between the output terminal and the second supply terminal as a function of the second current flow.

In response to first and second charge control signals causing the charge pump to operate in a first (e.g. charge-up) mode, the first differential means permits a first current having a first polarity to flow between the firs supply terminal and the output terminal. The second differential means causes the pump current mirror means to prohibit the flow of current between the output terminal and second supply terminal. In response to first and second digital charge control signals causing the charge pump to operate in a second (e.g. charge-down) mode, the first differential means prohibits the first current flow between the first supply terminal and the output terminal, while the second differential means causes the mirrored second current having the second polarity to flow between the output terminal and the second supply terminal. In response to first and second digital charge control signals causing the charge pump to operate in a third (e.g. hold) mode, the first differential means prohibits the first current flow between the first supply terminal and the output terminal, and the second differential means prohibits the mirrored second current flow between the output terminal and second supply terminal. The charge pump thereby has a zero hold current when operated in its hold mode.

The pump current mirror means is characterized by an inherent delay period. In preferred embodiments, the charge pump also includes delay circuit means coupled between the first input terminal means and the output terminal, for delaying response of the first current to the first charge control signals by a delay period equal to the delay period inherent in the pump current mirror means. Charge-up and charge-down pumping can thereby be symmetrically performed.

In still other embodiments, the charge pump includes gain control terminal means for receiving pumping gain control signals. Pumping gain control circuit means coupled between the pumping current gain control terminal means and a first current source means of the first differential means and a second current source means of the second differential means cause the first current source means to produce a first current flow having one of a plurality of different magnitudes, and cause the second current source means to produce a second current flow having one of a plurality of different magnitudes, in response to the pumping current gain control signals. The charge pump can thereby be selectively operable at one of a plurality of different pumping currents. Controllable delay circuit means coupled between the first input terminal means and the output terminal, and coupled to the pumping current gain control terminal means delay response of the first current to the first charge control signals by selected delay periods equal to inherent delay periods of the pump current mirror means, in response to the gain control signals.

DETAILED DESCRIPTION OF THE PREFERRED EMBODIMENTS

Figure 1:
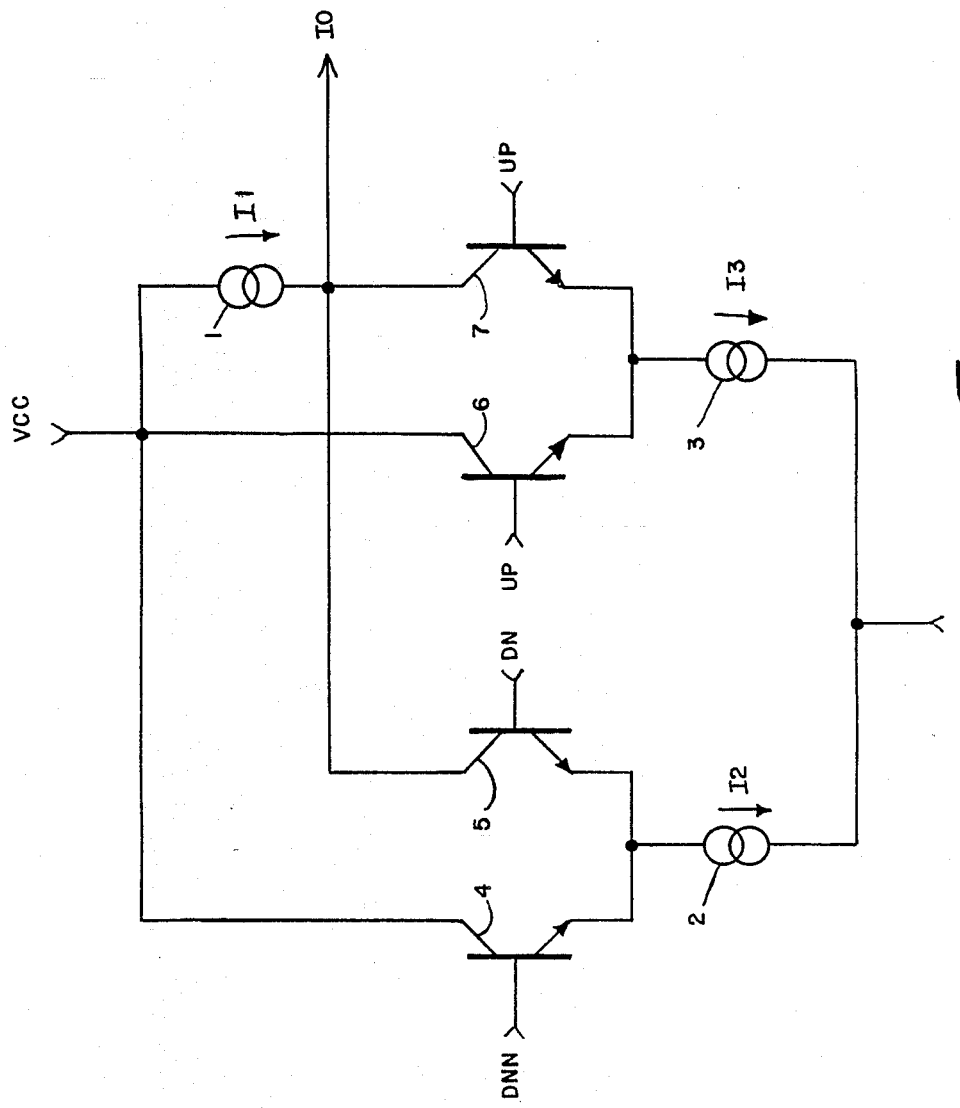
FIG. 1 is a schematic illustration of a prior art digitally controlled charge pump.
Figure 2:
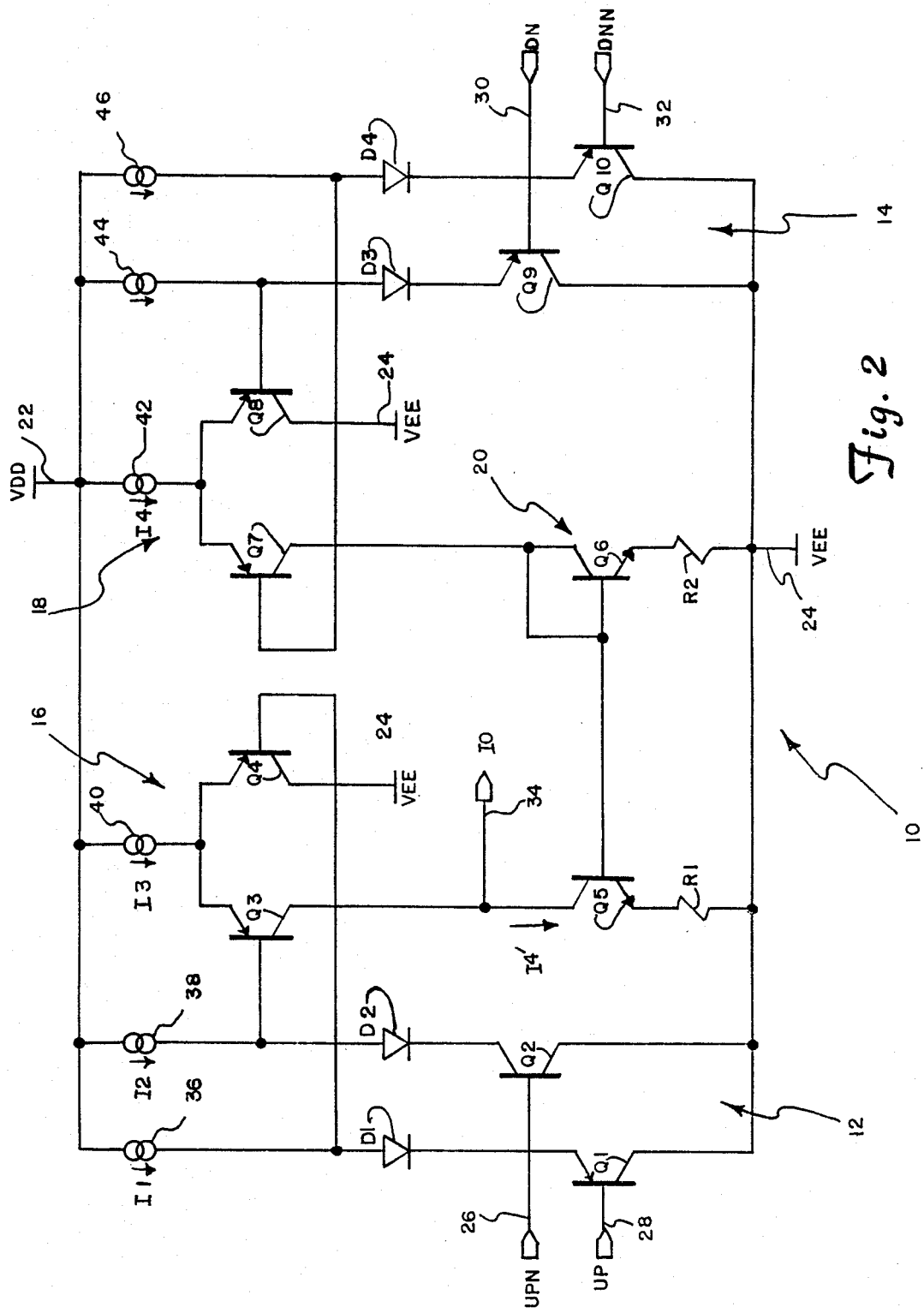
FIG. 2 is a schematic illustration of a high speed, zero hold current charge pump in accordance with the present invention.

A first embodiment to the present invention, integrated, high speed, zero hold current charge pump 10, is schematically illustrated in FIG. 2. Charge pump 10 includes first or charge-up input circuit 12, second or charge-down input circuit 14, first or charge-up differential amplifier 16, second or charge-down differential amplifier 18, and pump current mirror 20, all of which are interconnected between a first supply terminal 22 and a second supply terminal 24. Supply terminal 22 is connected to receive a relatively positive supply potential $V_{DD}$, while supply terminal 24 is connected to receive a relatively negative supply potential VEE. Charge-up input circuit 12 is connected to receive complementary digital charge-up control signals UP and UPN through charge-up input terminals 26 and 28. Charge-down input circuit 14 is connected to receive digital charge-down control signals DN and DNN over charge-down input terminals 30 and 32. An output terminal 34 is connected between charge-up differential amplifier 16 and current mirror 20.

Charge-up input circuit 12 is formed by PNP bipolar transistors Q1 and Q2, diodes D1 and D2, and current sources 36 and 38. The base of transistor Q1 is connected to input terminal 28, while the base of transistor Q2 is connected to input terminal 26. The collectors of transistors Q1 and Q2 are both coupled to second supply terminal 24. The emitter of transistor Q1 is connected to the cathode of diode D1, while the emitter of transistor Q2 is connected to the cathode of diode D2. Current sources 36 and 38 are connected between first supply terminal 22 and the anode of diodes D1 and D2, respectively. Current sources 36 and 38 provide currents I1 and I2, respectively. In one embodiment, currents I1 and I2 are both one milliampere in magnitude.

Charge-up differential amplifier 16 is formed by PNP transistors Q3 and Q4, and current source 40. Current source 40 is connected between first supply terminal 22 and the emitters of transistors Q3 and Q4. The collector of transistor Q3 is connected to output terminal 34, while the collector of transistor Q4 is connected to second supply terminal 24. The bases of transistors Q3 and Q4 function as an input to amplifier 16, and are connected to receive a differential signal present between the anodes of diodes D2 and D1, respectively.

Current source 40 provides a two milliampere current in one embodiment.

Current mirror 20 is formed by NPN transistors Q5 and Q6, and resistors R1 and R2. Resistor R1 is connected between second supply terminal 24 and the emitter of transistor Q5. The collector of transistor Q5 is coupled to output terminal 34. The base of transistor Q5 is connected to the base and collector of transistor Q6. The emitter of transistor Q6 is connected to second supply terminal 24 through resistor R2.

Charge-down differential amplifier 18 is formed by PNP transistors Q7 and Q8, and current source 42. Current source 42 is connected between first supply terminal 22 and the emitters of transistors Q7 and Q8. In preferred embodiments, current source 42 produces a current I4 of two milliamperes. The collector of transistor Q7 is connected to the collector of transistor Q6 of current mirror 20. The collector of transistor Q8 is connected to the second supply terminal 24. The bases of transistors Q7 and Q8 function as an input to differential amplifier 18, and are connected to receive a differential signal from charge-down input circuit 14.

Charge-down input circuit 14 is formed by PNP bipolar transistors Q9 and Q10, diodes D3 and D4, and current sources 44 and 46. The collectors of transistors Q9 and Q10 are connected to second supply terminal 24. The bases of transistors Q9 and Q10 are connected to input terminals 30 and 32, respectively. Transistor Q9 has its emitter connected to the cathode of diode D3, while the emitter of transistor Q10 is connected to the cathode of diode D4. Current source 44 is connected between first supply terminal 22 and the anode of diode D3. Current source 46 is connected between first supply terminal 22 and the anode of diode D4. The anode of diode D3 is also connected to the base of transistor Q8, while the anode of diode D4 is connected to the base of transistor Q7.

To operate charge pump 10 in its charge-up mode, UP and UPN signals having logic HIGH and LO states are applied to input terminals 28 and 26, respectively. DN and DNN signals having logic LOW and HIGH states are simultaneously applied to input terminals 30 and 32, respectively. Input circuits 12 and 14 shift the level of the input signals and provide differential control signals to their respective charge-up differential amplifier 16 and charge-down differential amplifier 18. The potential applied to the base of transistor Q3 will therefore be at a relatively negative value compared to the potential applied to the base of transistor Q4, causing transistor Q3 to be switched ON, and transistor Q4 to be switched OFF. As a result, current I3 provided by current source 40 flows through transistor Q3.

During this period the differential signal provided by charge-down input circuit 14 is such that a relatively negative potential is applied to the base of transistor Q8, as compared to the potential applied to the base of transistor Q7. Transistor Q8 is thereby switched ON while transistor Q7 is switched OFF, causing current I4 from current source 42 to flow through transistor Q8. Since no current is flowing through transistor Q7, transistor Q5 of current mirror 20 will be switched to its OFF state, effectively isolating output terminal 34 from second supply terminal 24. Current I3 flowing through transistor Q3 thereby functions as a charge-up pumping current which is sourced to and flows out output terminal 34 (i.e. has a first polarity).

To operate charge pump 10 in its charge-down mode, logic states of the charge-up input signals and charge-down input signals are reversed. UP and UPN signals having logic LOW and HIGH states are applied to terminals 28 and 26, respectively, while signals DN and DNN having logic HIGH and LOW states are applied to terminals 30 and 32, respectively. In response to these signals, charge-up input circuitry 12 provides a differential signal to charge-up differential amplifier 16 which forces the base of transistor Q3 to a relatively positive potential with respect to the potential applied to the base of transistor Q4. Transistor Q4 is thereby turned ON and shunts current I3 to second supply terminal 24, while transistor Q3 is turned OFF. Output terminal 34 is thereby electrically isolated from first supply terminal 22.

In response to the charge-down input signals, charge down input circuitry 14 provides a differential signal causing the base of transistor Q7 to be at a relatively negative potential compared to the potential at the base of transistor Q8. Transistor Q8 is thereby switched OFF, while transistor Q7 is switched ON. Current I4 provided by current source 42 thereby flows through transistor Q7, and transistor Q6 of current mirror 20. Current mirror 20 mirrors current I4, and produces a mirror current I4' through transistor Q5. This current is a charge-down pumping current which is sinked from output terminal 34 (i.e. has a second polarity) to second supply potential 24.

In the preferred embodiment described above in which currents I3 and I4 were two milliamperes, both the charge-up and charge-down pumping currents can be two milliamperes in magnitude. To operate charge pump 10 in its hold mode, input signals UP and UPN having logic LOW and HIGH states, and input signals DN and DNN having logic LOW and HIGH states, are applied to input terminals 28, 26, 30 and 32, respectively. The response of charge-up differential amplifier 16 and charge-down differential amplifier 18 to these input signals is identical to that described above. Transistor Q3 is switched OFF, isolating output terminal 34 from first supply terminal 22. Transistor Q7 is also switched OFF, thereby causing transistor Q5 to be turned OFF and isolating output terminal 34 from second supply terminal 24. Since transistors Q3 and Q5 are OFF, the hold current is inherently zero. The only current flowing from output terminal 34 will be the leakage current of transistor Q3, which is extremely small. The output impedance of transistors Q3 and Q5 in their OFF state is extremely high, so the effect of Early voltages is negligible.

Since current mirror 20 is used between charge-down differential amplifier 18 and output terminal 34, switching delay between charge-down input terminals 30 and 32 and output terminal 34 can be greater than that between charge-up input terminals 26 and 28 and the output terminal. This switching delay is due to the finite propagation delay of current mirror 20, which is fabricated of NPN transistors. If this delay is not compensated, charge pump 10 may generate steady-state error when used in a phase lock loop.

Figure 3:
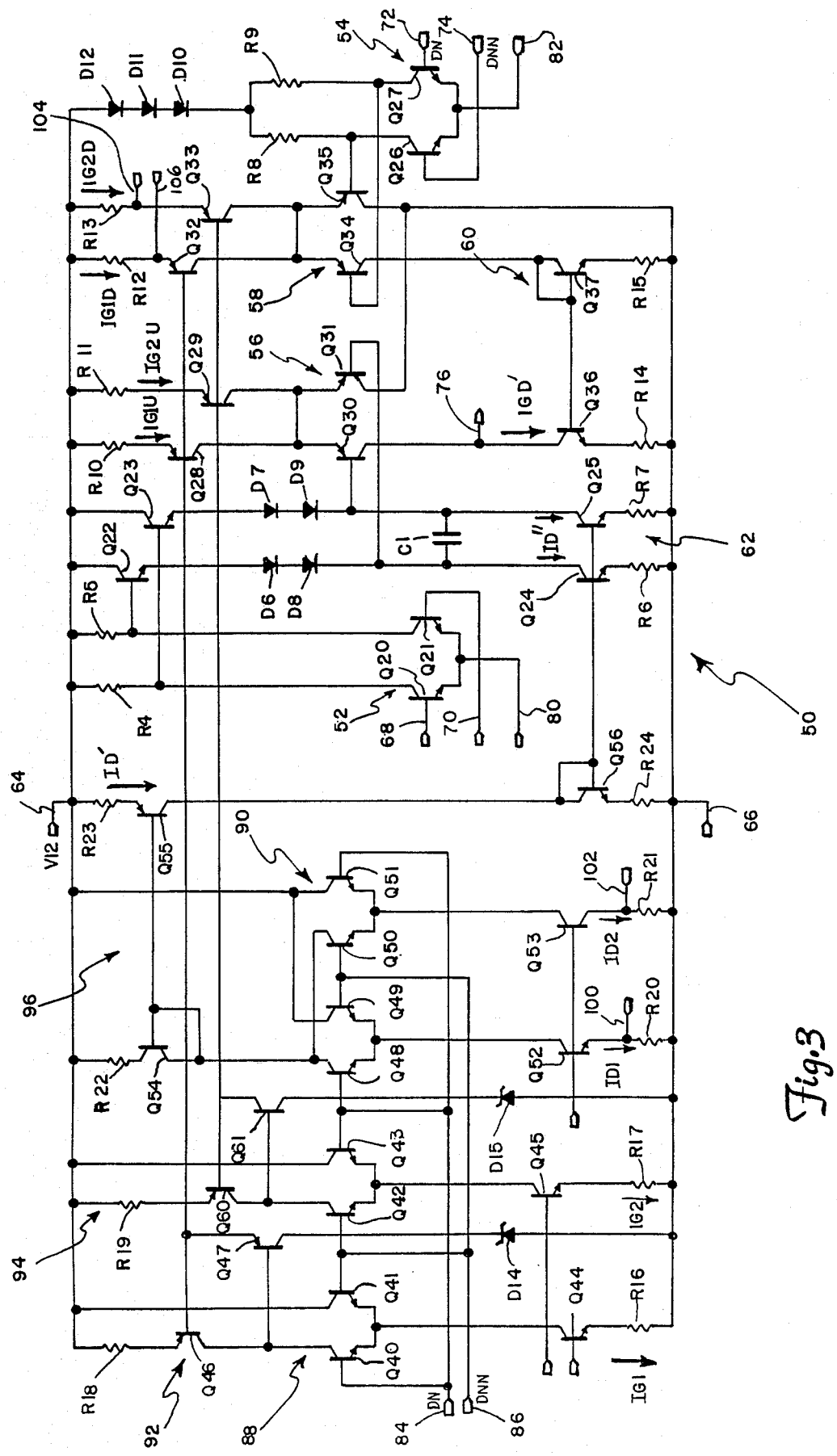
FIG. 3 is a schematic illustration of a high speed, zero hold current and delay compensated charge pump in accordance with the present invention, which can operate at one of two different pumping currents.

Charge pump 50, a second embodiment of the present invention, is schematically illustrated in FIG. 3. Charge pump 50 includes delay circuitry for compensating for the difference in delay between the charge-up and charge-down current paths created by the asymmetrical use of current mirrors. Furthermore, charge pump 50 is capable of operating at two different and selectable pumping currents.

Charge pump 50 includes charge-up input circuit 52, charge-down input circuit 54, charge-up differential amplifier 56, charge-down differential amplifier 58, pump current mirror 60 and selectable delay circuit 62, all of which are coupled between a first supply terminal 64 and a second supply terminal 66. Supply terminal 64 is connected to receive a first supply potential V12, while second supply terminal 66 is connected to receive a second supply potential VN1. Digital charge-up control signals U and UN are applied to charge-up input circuit 52 through terminals 68 and 70, respectively. Digital charge-down control signals DN and DNN are applied to charge-down input circuit 54 through terminals 72 and 74, respectively. Output terminal 76 is connected between current mirror 60 and charge-up differential amplifier 56.

Charge-up input circuit 52 includes NPN bipolar transistors Q20 and Q21 and resistors R4 and R5. The emitter of transistors Q20 and Q21 are coupled to receive a second bias potential BIAS2 from terminal 80. The base of transistor Q20 is connected to receive the U input signal from terminal 68, while the base of transistor Q21 is connected to receive the UN input signal from terminal 70. Resistor R4 couples the collector of transistor Q20 to supply terminal 64. Resistor R5 couples the collector of transistor Q21 to supply terminal 64.

Delay circuit 62 includes NPN transistors Q22, Q23, Q24, and Q25, resistors R6 and R7, capacitor C1 and diodes D6, D7, D8, and D9. Transistors Q24 and Q25 have their bases interconnected. The emitter of transistor Q24 is coupled to supply terminal 66 through resistor R6. The emitter of transistor Q25 is coupled to terminal 66 through resistor R7. The collector of transistor Q24 is connected to a first terminal of capacitor C1 and to a cathode of diode D8. The collector of transistor Q25 is connected to a second terminal of capacitor C1, and to a cathode of diode D9. The anode of diode D8 is coupled to the cathode of diode D6, while the anode of diode D9 is coupled to the cathode of diode D7. Transistor Q22 has its collector connected to supply terminal 64 and its emitter connected to the anode of diode D6. Transistor Q23 has its collector connected to supply terminal 64 and its emitter connected to the anode of diode D7. The base of transistor Q22 is coupled to charge-up input circuitry 52 at the collector of transistor Q21, while the base of transistor Q23 is coupled to the charge-up input circuit at the collector of transistor Q20.

Charge-down input circuit 54 includes NPN bipolar transistors Q26 and Q27, resistors R8 and R9, and diodes D10, D11, and D12. The emitters of transistors Q26 and Q27 are connected to receive a first bias potential BIAS1 from terminal S2. The base of transistor Q26 is connected to receive the DNN input signal from input terminal 74, while the base of transistor Q27 is connected to receive the DN signal from terminal 72. Diodes D10–D11 are connected in series between supply terminal 64 and a first terminal of resistors R8 and R9. A second terminal of resistor R8 is connected to a collector of transistor Q26, while a second terminal of resistor R9 is connected to a collector of transistor Q27.

Charge-up differential amplifier 56 is formed by PNP bipolar transistors Q28, Q29, Q30, and Q31 and resistors R10 and R11. The emitters of transistors Q30 and Q31 are connected together and to the collectors of transistors Q28 and Q29. The bases of transistors Q30 and Q31 are connected to the cathodes of diodes D9 and D8, respectively, to receive a differential input signal. The collector of transistor Q30 is connected to output terminal 76, while the collector of transistor Q31 is connected to second supply terminal 66. The emitter of transistor Q28 is connected to first supply terminal 64 through resistor R10, while the emitter of transistor Q29 is connected to the first supply terminal through resistor R11.

Charge-down differential amplifier 58 includes PNP bipolar transistors Q32, Q33, Q34, and Q35 and resistors R12 and R13. The collector of transistor Q34 is coupled to current mirror 60, while the collector of transistor Q35 is coupled to second supply terminal 66. The bases of transistors Q34 and Q35 receive a differential signal from charge-down input circuit 54, the base of transistor Q34 being coupled to the collector of transistor Q27, and the base of transistor Q35 being coupled to the collector of transistor Q26. The emitters of transistors Q34 and Q35 are coupled together and to the collectors of transistors Q32 and Q33. First supply terminal 64 is coupled to the emitter of transistor Q32 through resistor R12, while the first supply terminal is coupled to the emitter of transistor Q33 through resistor R13.

Current mirror 60 is formed by NPN bipolar transistors Q36 and 037 and resistors R14 and R15. The collector of transistor Q36 is connected to output terminal 76. Second supply terminal 66 is coupled to the emitter of transistor Q36 through resistor R14. Second supply terminal 66 is coupled to the emitter of transistor Q37 through resistor R15. The base and collector of transistor Q37 are connected to the collector of transistor Q34, and to the base of transistor Q36.

Charge pump 50 can operate at two different and independently selectable pumping currents. This operation is facilitated by the use of two different current sources in each of charge-up differential amplifier 56 and charge-down differential amplifier 58. Transistors Q28 and Q32 function as current sources in conjunction with current mirror circuitry yet to be described and provide a first gain charge-up current IG1U and a first gain charge-down current IG1D, respectively, when selected. Transistors Q29 and Q33 function as current sources in conjunction with still other current mirror circuitry yet to be described and provide a second gain charge-up current IG2U and a second gain charge-down current IG2D to charge-up differential amplifier 56 and charge-down differential amplifier 58, respectively.

The delay inherent within current mirror 60 is functionally related to the magnitude of the selected charge-down current IG1D or IG2D provided through charge-down differential amplifier 58. The delay of delay circuitry 62 which is used to compensate for the delay of current mirror 60 must therefore be selected as a function of the selected pumping current. Accordingly, transistors Q24 and Q25 function as current sources in conjunction with current mirror circuitry yet to be described and produce a delay current ID" having one of two magnitudes which cause the delay imposed by delay stage 62 to correspond to the delay of current mirror 60 with the selected pumping current.

To perform the pumping current gain and associated delay selection, charge pump 50 includes a pumping gain control current multiplexer 88 and a delay control current multiplexer 90. Multiplexer 88 is formed by a first emitter coupled pair of NPN bipolar transistors Q40 and Q41, and a second emitter coupled pair of NPN bipolar transistors Q42 and Q43. multiplexer 88 also includes NPN bipolar transistors Q44 and Q45 and resistors R16-R17. The bases of transistors Q40 and Q43 are connected to receive gain control signals GN on terminal 84. The bases of transistors Q41 and Q42 are connected to receive gain control signals GNN on terminal 86. The emitters of transistors Q40 and Q41 are coupled to the collector of transistor Q44. The collector of transistor Q41 is coupled to supply terminal 64. The emitter of transistor Q44 is connected to second supply terminal 66 through resistor R16. The base of transistor Q44 is connected to receive a bias potential VAHG. Transistor Q44 and resistor R16 function as a current source, and produce a first or high gain control current IG1. The emitters of transistors Q42 and Q43 are coupled to the collector of transistor Q45. The collector of transistor Q43 is connected to supply terminal 64. The emitter of transistor Q45 is connected to second supply terminal 66 through resistor R17. The base of transistor Q45 is connected to receive a second bias voltage VALG. Transistor Q45 and resistor R17 function as a current source and generate a second or low gain control current IG2.

Transistor Q40 of multiplexer 88 is coupled to transistors Q28 and Q32 of charge-up differential amplifier 56 and charge-down differential amplifier 58, respectively, by means of first gain current mirror 92. Current mirror 92 is formed by PNP bipolar transistors Q46 and Q47, zener diode D14 and resistor R18. The collector of transistor Q46 is coupled to the collector of transistor Q40 and to the base of transistor Q47. The emitter of transistor Q46 is connected to first supply terminal 64 through resistor R18. Transistor Q47 has its collector connected to the cathode of diode D14, while the anode of the diode is connected to second supply terminal 66. The base of transistor Q46 is connected to the emitter of transistor Q47 and to the bases of transistors Q28 and Q32.

Transistor Q42 of the second emitter coupled pair of multiplexer 88 is coupled to transistors Q29 and Q33 of charge-up differential amplifier 56 and charge-down differential amplifier 58, respectively, by means of second gain current mirror 94. Current mirror 94 includes PNP transistors Q60 and Q61, zener diode D15 and resistor R19. The collector of transistor Q60 is coupled to the collector of transistor Q42 and to the base of transistor Q61. The emitter of transistor Q60 is connected to first supply terminal 64 through resistor R19. The collector of transistor Q61 is connected to the cathode of diode D15 while the anode of the diode is connected to second supply terminal 66. The base of transistor Q60 and emitter of transistor Q61 are connected to the bases of transistors Q29 and Q33.

Delay control current multiplexer 90 includes a first emitter coupled pair of transistors Q48 and Q49, a second emitter coupled pair of transistors Q50 and Q51, and a pair of current sources formed by transistors Q52, Q53, and resistors R20 and R21. The emitters of transistors Q48 and Q49 are coupled to the collector of transistor Q52. The bases of transistors Q48 and Q49 are connected to receive the GN and GNN gain control signals applied to terminals 84 and 86, respectively. The base of transistor Q52 is connected to receive a current source bias voltage CURS2, while the emitter of this transistor is coupled to second supply terminal 66 through resistor R20.

The emitters of transistors Q50 and Q51 are connected to the collector of transistor Q53. The bases of transistors Q50 and Q51 are connected to receive the GNN and GN gain control signals applied to terminals 86 and 84, respectively. The collector of transistor Q51 is connected to first supply terminal 64. The base of transistor Q53 is connected to receive the second current source bias potential CURS2, while the emitter of this transistor is coupled to second supply terminal 66 through resistor R21.

Delay control current multiplexer 90 is coupled to transistors Q24 and Q25 of delay circuit 62 by means of delay control current mirror 96. Current mirror 96 includes transistors Q54, Q55, and Q56, and resistors R22, R23, and R24. The collector and base of transistor Q54 is connected to the collector of transistor Q48, while the emitter of this transistor is connected to first supply terminal 64 through resistor R22. The collector of transistor Q55 is coupled to the collector and base of transistor Q56. The base of transistor Q55 is connected to the base of transistor Q54. The emitter of transistor Q53 is connected to first supply terminal 64 through resistor R23. The emitter of transistor Q56 is connected to second supply terminal 66 through resistor R24. The base of transistor Q54 is connected to the base of transistors Q24 and Q25 of delay circuit 62.

The current source formed by transistor Q44 and resistor R16 is configured to produce a first gain pumping control current IG1. The current source formed by transistor Q45 and resistor R17 is configured to produce a second gain pumping control current IG2. In one preferred embodiment, second gain pumping control current IG2 is twenty times greater than first gain pumping control current IG1. The current source formed by transistor Q52 and resistor R20 is configured to provide a first gain delay control current ID1, while the current source formed by transistor Q53 and resistor R21 is configured to produce a second gain delay control current ID2.

When it is desired to operate charge pump 50 with its first or high gain pumping current, GN and GNN signals having logic HIGH and LOW logic states are applied to terminals 84 and 86, respectively. Current multiplexer 88 thereby selects first gain pumping control current IG1 since transistor Q40 will be turned ON, while transistor Q42 will be turned OFF. Current IG1 will flow through transistors Q46 and Q40, and is mirrored into current source transistors Q28 and Q32 of charge-up differential amplifier 56 and charge-down differential amplifier 58, respectively. First gain charge-up current IG1U and first gain charge-down current IG1D are thereby produced as a function of current IG1, and preferably have the same magnitude.

Delay current multiplexer 90 simultaneously selects first gain delay control current ID1 since transistor Q48 is turned ON, and transistor Q50 is turned OFF. Current ID1 will flow through transistors Q55 and Q56, is mirrored into transistors Q53 and Q54 as delay current ID', and is from there mirrored into current source transistors Q24 and Q25 which produce delay currents ID". Currents ID" are thereby provided as a function of current ID1. Characteristics of transistor Q52 and resistor R20 which form the current source, and/or the various resistors and transistors of current mirror 96, are selected to produce currents ID" of a magnitude which will cause delay circuit 62 to delay switching response of charge-up differential amplifier 56 in response to charge-up control signals applied to charge-up input circuit 52 by a time delay corresponding to the inherent delay in current mirror 60 when operating with first gain charge-down current IG1D.

Should it be desired to operate charge pump 50 with its second gain pumping current, GN and GNN signals having logic LOW and HIGH states, respectively, are applied to terminals 84 and 86. Gain current multiplexer thereby selects second gain control current IG2 since transistor Q40 is switched OFF, and transistor Q42 is switched ON. Current IG2 flows through transistors Q60 and Q42, and is mirrored by current mirror 94 into transistors Q29 and Q33 of charge-up differential amplifier 56 and charge-down differential amplifier 58, respectively. Second gain charge-up pumping current IG2U and second gain charge-down pumping current IG2D are thereby applied to differential amplifiers 56 and 58, respectively, as a function of second gain control current IG2.

Concurrently, delay current multiplexer 90 will select second gain delay control current ID2 since transistor QS is switched OFF, and transistor Q50 is switched ON. Current ID2 will flow through transistors Q54 and Q50, be mirrored into transistors Q55 and Q56 as delay current ID', and is from there mirrored into current source transistors Q24 and Q25. Transistors Q24 and Q25 will product currents ID" as a function of current ID2 so as to have a magnitude which causes delay circuit 62 to impose a delay between the switching of charge-up control signals UN and UNN and charge-up differential amplifier 56 which corresponds to the delay of current mirror 60 when operating with second gain charge-down current IG2D.

Having selected the desired pumping current or gain and its associated charge-up switching delay in the manner described above, charge pump 50 operates in a manner similar to that of charge pump 10 already described. Charge pump 50 operates in a charge-up mode sourcing either first gain charge-up current IG1U or second gain charge-up current IG2U to terminal 76 when charge-up signals U and UN have logic HIGH and LOW states, respectively, and charge-down control signals DN and DNN have logic LOW, and HIGH states, respectively. Charge pump 50 operates in its charge-down mode sinking one of either charge-down current IG1D' or IG2D' from output terminal 76 when control signals U and UN have logic LOW, HIGH states and control signals DN and DNN have logic HIGH, LOW states, respectively. When charge-up control signals U and UN have logic LOW, HIGH states and charge-down control signals DN and DNN have logic LOW, HIGH states, respectively, charge pump 50 is operated in its hold mode with both transistors Q30 and Q36 switched OFF. Output terminal 76 is thereby isolated from supply terminals 64 and 66.

The delay exhibited by delay circuitry 62 can be externally adjusted through the application of DADJH and DADJL signals applied to terminals 100 and 102, respectively. Terminal 100 is coupled to the emitter of transistor Q52, while terminal 102 is coupled to the emitter of transistor Q53. Signals DADJH and DADJL are used to adjust the magnitude of currents ID1 and ID2, and therefore the magnitude of currents ID" and the delay of delay circuit 62.

External signals GADJL and GADJH can be applied to the emitters of transistors Q32 and Q33 through terminals 104 and 106, respectively. Signals GADJL and GADJH are used to adjust the magnitude of currents IG1DN and IG2D, and thereby the cancellation of the pump-up and pump-down currents at output terminal 76 when charge pump 50 is trying to pump up and down at the same time. This cancellation is generally of minimal importance since the period of time that this situation occurs is typically very short.

Although the present invention has been described with reference to the preferred embodiments, those skilled in the art will realize that changes may be made in form and detail without departing from the spirit and scope of the invention.

What is claimed is:

1. A digitally controlled charge pump, including:
   first and second supply terminals;
   first input terminal means for receiving first digital charge control signals;
   second input terminal means for receiving second digital charge control signals;
   an output terminal;
   first transistorized differential amplifier means including first control input terminal means coupled to the first input terminal means and second and third terminal means defining a first main current flow path and coupled between the first supply terminal and the output terminal, for controlling a first current flow of a first polarity between the first supply terminal and the output terminal through the first main current flow path as a function of the first control signals;
   second transistorized differential amplifier means including a first control input terminal means coupled to the second input terminal means and second and third terminal means defining a second main current flow path and coupled between the first and second supply terminals, for controlling a second current flow between the first and second supply terminals through the second main current flow path as a function of the second control signals; and
   transistorized pump current mirror means including first and second terminal means connected in series with the record main current flow path of the second differential means and third and fourth terminal means coupled between the output terminal and the second supply terminal, for producing and controlling a mirrored second current flow of a second polarity between the output terminal and the second supply terminal as a function of the second current flow.

2. The charge pump of claim 1 wherein:
   the first differential amplifier means includes first current source means coupled between the first supply terminal and the output terminal, for producing the first current flow; and
   the second differential amplifier means includes second current source means coupled between the first and second supply terminals, for producing the second current flow.

3. The charge pump of claim 2 wherein:
   the first differential amplifier means includes:
      a first transistor having first and second terminals connected in series with the first current source means and between the first supply terminal and the output terminal, and a control terminal coupled to the first input terminal means; and
      a second transistor having first and second terminals coupled in series with the first current source means and between the first and second supply terminal means, and a control terminal coupled to the first input terminal means; and
   the second differential means includes:

a third transistor having first and second terminals coupled in series with the second current source means and between the first and second supply terminals, and a control terminal coupled to the second input terminal means; and a fourth transistor having first and second terminals coupled in series with the second current source means and between the first and second supply terminals, and a control terminal coupled to the second input terminal means.

4. The charge pump of claim 3 wherein the pump current mirror means includes:

a fifth transistor having first and second terminals coupled in series with the first and second terminals of the third transistor and between the first and second supply terminals, and a control terminal; and a sixth transistor having first and second terminals coupled between the output terminal and the second supply terminal, and a control terminal coupled to the control terminal of the fifth transistor.

5. The charge pump of claim 4 wherein the pump current mirror means further includes:

a first resistor coupled between the first or second terminal of the fifth transistor and the second supply terminal; and a second resistor coupled between the first or second terminal of the sixth transistor and the second supply terminal.

6. The charge pump of claim 4 wherein:

the first and second transistors of the first differential means and the third and fourth transistors of the second differential means are transistors of a first conductivity type; and the fifth and sixth transistors of the pump current mirror means are transistors of a second conductivity type.

7. The charge pump of claim 6 wherein:

the first, second, third and fourth transistors are PNP bipolar transistors; and the fifth and sixth transistors are NPN bipolar transistors.

8. The charge pump of claim 2 and further including:

pumping current gain control terminal means for receiving pumping current gain control signals; and pumping current gain control transistorized circuit means coupled between the pumping current gain control terminal means and the first and second current source means, for causing the first current source means to produce a first current flow having one of a plurality of different magnitudes, and for causing the second current source means to produce a second current flow having one of a plurality of different magnitudes, in response to the pumping current gain control signals.

9. The charge pump of claim 8 wherein:

the pump current mirror means is characterized by inherent delay periods functionally related to the magnitude of the second current flow; and the charge pump further includes controllable delay circuit means coupled between the first input terminal means and the output terminal and coupled to the pumping current gain control terminal means, for delaying response of the first current flow to the first charge control signals by delay periods equal to the inherent delay periods of the pump current mirror means, in response to the gain control signals.

10. The charge pump of claim 9 wherein the pumping current gain control circuit means includes:

first gain control current source means for producing a first gain control current having a first magnitude;

second gain control current source means for producing a second gain control current having a second magnitude;

gain control current multiplexer means coupled to the gain control terminal means and to the first and second gain control current source means, for selecting one of the first and second gain control currents as a function of the gain control signals; and gain control current mirror means coupled between the gain control current multiplexer means and the first and second current source means, for mirroring the selected gain control current to the first and second current source means and causing the magnitude of the first and second currents to be produced as a function of the magnitude of the selected gain control current.

11. The charge pump of claim 10 wherein:

the first current source means of the first differential amplifier means includes:
 a first gain first current source; and
 a second gain first current source;

the second current source means includes:
 a first gain second current source; and
 a second gain second current source; and the gain control current mirror means includes:
 a first gain current mirror coupled to the gain control current multiplexer means, the first gain first current source and the first gain second current source, for mirroring the first gain control current to the first gain first current source and to the first gain second current source when the first gain control current is selected by the gain control current multiplexer means; and
 a second gain current mirror coupled to the gain control current multiplexer means, the second gain first current source and the second gain second current source, for mirroring the second gain control current to the second gain first current source and to the second gain second current source when the second gain control current is selected by the gain control current multiplexer means.

12. The charge pump of claim 9 wherein the controllable delay circuit means includes:

a current responsive delay circuit coupled between the first input terminal means and the first differential means, and including a delay circuit current source;

first delay control current source means for producing a first delay control current having a first magnitude;

second delay control current source means for producing a second delay control current having a second magnitude;

delay control current multiplexer means coupled to the gain control terminal means and to the first and second delay control current source means, for selecting one of the first and second delay control currents as a function of the gain control signals; and delay control mirror means for mirroring the selected delay control current to the delay circuit current source and causing the magnitude of the current produced by the delay current source to be produced as a function of the magnitude of the selected delay control current.

13. The charge pump of claim 1 and further including:

first transistorized input circuit means coupled between the first input terminal means and the first control input terminal means of the first differential amplifier means, for level shifting the first digital charge control signals; and second transistorized input circuit means coupled between the second input terminal means and the first control input terminal means of the second differential amplifier means, for level shifting the second digital charge control signals.

14. The charge pump of claim 1 wherein:

the pump current mirror means is characterized by an inherent delay period, between the response of the mirrored second current flow to the second current flow; and the charge pump further includes delay circuit means coupled between the first input terminal means and the output terminal, for delaying the response of the first current flow to the first charge control signals by a delay period equal to the inherent delay period of the pump current mirror means.

15. The charge pump of claim 14 wherein the delay circuit means includes circuit means connected between the first differential amplifier means and the pump current mirror means.

* * * * *

UNITED STATES PATENT AND TRADEMARK OFFICE
CERTIFICATE OF CORRECTION

PATENT NO. : 4,847,519

DATED : July 11, 1989

INVENTOR(S) : Jerry R. Wahl et al.

It is certified that error appears in the above-identified patent and that said Letters Patent is hereby corrected as shown below:

Column 12, line 38, delete "record" and insert --second--.

Signed and Sealed this

Twenty-first Day of November, 1989

Attest:

JEFFREY M. SAMUELS

*Attesting Officer*   *Acting Commissioner of Patents and Trademarks*